United States Patent
Yang et al.

(10) Patent No.: US 7,362,644 B2
(45) Date of Patent: Apr. 22, 2008

(54) CONFIGURABLE MRAM AND METHOD OF CONFIGURATION

(75) Inventors: Hsu Kai Yang, Pleasanton, CA (US); Po-Kang Wang, San Jose, CA (US); Xizeng Shi, Fremont, CA (US)

(73) Assignees: MagIC Technologies, Inc., Milpitas, CA (US); Applied Spintronics, Inc., Milpitas, CA (US)

( * ) Notice: Subject to any disclaimer, the term of this patent is extended or adjusted under 35 U.S.C. 154(b) by 160 days.

(21) Appl. No.: 11/313,019

(22) Filed: Dec. 20, 2005

(65) Prior Publication Data

US 2007/0140033 A1    Jun. 21, 2007

(51) Int. Cl.
*G11C 11/06* (2006.01)
(52) U.S. Cl. .................. 365/225.5; 365/226; 365/200
(58) Field of Classification Search ............. 365/225.5, 365/226, 228, 229, 200, 201, 173, 171
See application file for complete search history.

(56) References Cited

U.S. PATENT DOCUMENTS

| | | | |
|---|---|---|---|
| 6,336,161 B1 | 1/2002 | Watts | |
| 6,421,271 B1 | 7/2002 | Gogl et al. ................. 365/158 |
| 6,462,985 B2 | 10/2002 | Hosono et al. ........ 365/185.09 |
| 6,473,335 B2 | 10/2002 | Böhm et al. ................. 365/158 |
| 6,487,108 B2 | 11/2002 | Pöchmüller .................. 365/158 |
| 6,577,527 B2 | 6/2003 | Freitag et al. .............. 365/158 |
| 6,781,896 B2 | 8/2004 | Lammers et al. ........... 365/200 |
| 6,791,871 B2 | 9/2004 | Freitag et al. .............. 365/158 |
| 7,110,290 B2* | 9/2006 | Ooishi ........................ 365/173 |
| 2003/0090935 A1 | 5/2003 | Hidaka | |
| 2005/0243620 A1 | 11/2005 | Imamiya et al. | |

FOREIGN PATENT DOCUMENTS

JP    63275097    11/1988

* cited by examiner

*Primary Examiner*—Son Dinh
*Assistant Examiner*—Hien N Nguyen
(74) *Attorney, Agent, or Firm*—Saile Ackerman LLC; Stephen B. Ackerman

(57) ABSTRACT

A configurable MRAM device is achieved. The device comprises a memory array of magnetic memory cells. A first part of the array comprises the memory cells that can be accessed for reading and writing during normal operation. A second part of the array comprises the memory cells that can be read only during a power up initialization. The second part of the array is used to store configuration data for altering the physical operation of the memory array. Programmable current sources and timing delays use the stored configuration data to optimize device performance. A redundant section of memory cells is activated by the configuration data.

33 Claims, 11 Drawing Sheets

OPPOSITE POLARITY

SAME POLARITY $V_C' > V_C''$

CONFIGURATION DATA

| Row | Data | Group |
|---|---|---|
| ROW 0 | PROGRAMMABLE CURRENT #1 | FIXED |
| ROW 1 | PROGRAMMABLE CURRENT #2 | |
| ROW 2 | PROGRAMMABLE CURRENT #3 | |
| ROW 3 | PROGRAMMABLE CURRENT #4 | |
| ROW 4 | PROGRAMMABLE CURRENT #5 | |
| ROW 5 | PROGRAMMABLE CURRENT #6 | |
| ROW 6 | PROGRAMMABLE TIMING #1 | |
| ROW 7 | PROGRAMMABLE TIMING #2 | |
| ROW 8 | PROGRAMMABLE TIMING #3 | |
| ROW 9 | PROGRAMMABLE TIMING #4 | |
| ROW 10 | REDUNDANT BLOCK SIZE | |
| ROW 11 | REDUNDANT ADDRESS 0 | VARIABLE |
| ROW 12 | REDUNDANT ADDRESS 1 | |
| ⋮ | ⋮ | |
| ROW 10+n | REDUNDANT ADDRESS n | |

CONFIGURABLE MRAM AND METHOD OF CONFIGURATION

BACKGROUND OF THE INVENTION (1) Field of the Invention

The invention relates generally to non-volatile memory devices. More particularly, this invention relates to a magnetic random access memory (MRAM) device. Even more particularly, this invention relates to a configurable MRAM device having novel device architecture and novel methods for configuration.

(2) Description of the Prior Art

Magnetic memory devices are known in the art as a magnetic-based alternative to electrical-based memories. Magnetic memories are typically constructed from ferromagnetic materials. The particular type of magnetic memories described herein rely on magnetic polarization of ferromagnetic layers to store binary data states (0 and 1) and rely on tunnel-magneto-resistance (TMR) effects to read out these stored states. Referring now to FIG. 1, an exemplary magnetic memory cell 10 is shown in schematic form for two polarity cases. The magnetic memory cell 10 comprises two ferromagnetic layers 12 and 16. One ferromagnetic layer 12 comprises soft magnetic material, while the other ferromagnetic layer 16 comprises a hard magnetic material. The soft magnetic layer 12 and the hard magnetic layer 16 are each capable of holding a magnetic polarization as is shown by the directional arrow on each layer in the schematic. The magnetic polarization of the soft layer 12 can be altered by exposure to magnetic fields generated within the memory during normal operation. However, the magnetic polarization of the hard layer 16 cannot be altered after manufacturing. The hard layer 16 is therefore called a pinned layer 16 while the soft layer is called a free layer 12.

The pinned layer 16 and the free layer 12 are separated by a dielectric layer 14. Therefore, any current flow between the free layer 12 and pinned layer 16 must traverse the dielectric layer 14 by tunneling through the dielectric 14. It is known in the art that a relationship exists between the magnetic polar orientation of the free layer 12 with respect to the pinned layer 16 and the effective resistance of the memory stack 10. If as shown in the upper illustration, the free layer 12 is oriented in a polarity opposite that of the pinned layer 16, then a current source $I_C$ will generate a first voltage drop $V_C'$. If the polarity of the free layer 12 is then reversed, as shown in the lower illustration, then the same current source $I_C$ will generate a second voltage drop $V_C''$ that is a different value than the first voltage drop. It is further known that the second voltage drop $V_C''$ will be substantially less than the first voltage drop $V_C'$. Alternatively, the effective resistance of the device 10 is higher when the free layer 12 and pinned layer 16 have opposite orientations and is lower when the orientations are the same. This phenomenon is called a tunnel-magneto-resistance (TMR) effect. The device 10 is typically called a magnetic tunnel junction (MTJ). The TMR effect can be used to distinguish between two physical states of the MTJ device such that binary data can be stored and read. Therefore, the MTJ device 10 is called a MTJ memory cell, a magneto-resistive cell, or simply a magnetic memory cell.

Referring now to FIG. 2, the exemplary magnetic memory cell 10 is shown in a simplified isometric illustration. In a typical application, many thousands or millions of memory cells 10 are formed in two or three dimensional arrays. In a typical array, the memory cells 10 are formed at the crossing points of perpendicular conductive lines in the memory array. In the illustrated example, a conductive word line WL 24 is formed under the magnetic memory cell 10 and a conductive bit line BL 20 is formed over the cell 10. For reasons that will be explained below, the bit line BL 20 electrically contacts the cell 10. As described above, the magnetic polarity of the free layer of the cell 10 can be altered by magnetic fields produced within the memory array. More particularly, the magnetic array produces magnetic fields capable of flipping the polarity of the free layer between same polarity and opposite polarity states with respect to the pinned layer. Typically, the memory array utilizes the word line WL 24 and bit line BL 20 conductors to generate localized magnetic fields $H_{WL}$ and $H_{BL}$.

When an electrical current travels through any conductor, a magnetic field is generated by the movement of the electrical charges. This magnetic field forms as continuous field lines that surround the conductor and that are perpendicular to the direction of current flow. In addition, the orbital direction of the magnetic field lines (clockwise, counterclockwise) depends on the direction of the current flow in the conductor. Finally, the magnitude of the magnetic field is proportional to the current value in the conductor. In the exemplary case, current $I_{BL}$ flows in the bit line BL 20 and generates a bit line magnetic field $H_{BL}$. Likewise, current $I_{WL}$ flows in the word line WL 24 and generates a word line magnetic field $H_{WL}$. As can be seen, the bit line and word line magnetic field lines that surround the conductors will intersect the memory cell 10 and these intersections will occur from different directions. It is known in the art that the interaction of the bit line field $H_{BL}$ and the word line field $H_{WL}$ can be advantageously used to selectively magnetize the free layer of the cell 10 to a particular orientation while not disturbing the state of any other cells. To accomplish this, the word line and bit line currents $I_{WL}$ and $I_{BL}$ are kept low enough such that the magnetic fields $H_{WL}$ and $H_{BL}$ generated from the selected word line WL 24 and bit line BL 20 are not sufficient, by themselves, to change the free layer orientation of any cells 10. However, when the magnetic fields $H_{WL}$ and $H_{BL}$ combine at an intersection, as in the example, then the selected cell 10 will be programmed.

Referring now to FIG. 3, a schematic illustrates an exemplary programming technique used in many magnetic memory arrays. In this section of the array, several memory cells C1, C2, and C3 are connected to a common bit line BL1. Each cell has a separate word line WL1, WL2, and WL3. In addition, each cell has a separate selection transistor 44, 46, and 48 coupled between the cell and ground. In this example, memory cell C2 is selectively programmed by conducting current $I_{BL1}$ through the bit line BL1 and by conducting current $I_{WL}$ through the word line WL2. A fixed current direction is used for the word line current $I_{WL}$. However, the direction of the bit line current $I_{BL1}$ is determined by the data value (0 or 1) that is to be written into the cell. In the schematic, switches SW1 and SW2 allow the bit line programming current $I_{PROG1}$ to flow from left to right to ground. The combination of the magnetic fields from the bit line and word line currents $I_{BL1}$ and $I_{WL}$ is sufficient to program the free layer of the selected cell C2 to a first binary state of, for example, an opposite magnetic orientation to that of the pinned layer. If switches SW1 and SW2 are set to allow the programming current $I_{PROG2}$ to flow from right to left, then the cell C2 is programmed to the second binary state of, for example, the same magnetic orientation as the pinned layer.

Care must be taken in the above-described programming method to insure that the bit line and word line currents $I_{BL1}$ and $I_{WL}$ are sufficient, in combination, to generate optimal magnetic fields to program the selected cell while not disturbing unselected cells. Insufficient programming current may result in slow or unreliable programming. Alternatively, excessive programming current may result in uncontrolled re-programming of non-selected cells. To achieve optimal performance, a proper balance between bit line and word line programming currents $I_{BL1}$ and $I_{WL}$ must be established. As an addition consideration, the relative timing of the bit line and word line currents $I_{BL1}$ and $I_{WL}$ is critical to achieving a necessary combined magnetic field vector for the required time to program the selected cell. Minimal $I_{BL1}$ and $I_{WL}$ current overlap is desired to achieve high speed operation with minimal power consumption. However, inadequate current overlap may result in unreliable programming. Achievement of optimal performance over a large number of manufactured memory arrays is difficult due to lot-to-lot or even device-to-device variation in processing parameters.

Referring now to FIG. 4, an exemplary cell reading technique for a magnetic memory array is illustrated for the exemplary array section. During a reading operation, switch SW1 is set to allow reading current $I_{READ}$ to be conducted through the bit line BL1. To select a cell for reading, its selection transistor is turned ON. In the schematic, the selection transistor 44 is turned ON to provide a low resistance path from one layer of cell C1 to ground. The bit line current $I_{BL1}$ is thereby conducted from the bit line BL1, through cell C1 and transistor 44, and into ground. As a result, current flowing through the cell C1 exhibits the tunnel-magneto-resistance (TMR) effect such that the resulting voltage drop across the cell C1 varies depending on the relative magnetic orientation of the free and pinned layers. Switch SW2 is set to present the bit line BL1 voltage, comprising substantially the selected cell C1 voltage drop, to a sense amplifier, or comparator, 50. The bit line BL1 voltage $V_{BL1}$ is compared to a reference level REF. If the bit line voltage $V_{BL1}$ is greater than REF then the read-out state $D_{OUT}$ of the cell C1 is one of the binary values (such as logic "0"). If the bit line voltage $V_{BL1}$ is less than REF then the read-out state $D_{OUT}$ of the cell C1 is another of the binary values (such as logic "1").

Care must be taken in the above-described reading method to insure that the reading current $I_{READ}$ is sufficient to generate an optimal voltage drop across the selected cell. Insufficient reading current may result in cell voltage drops that are too small to provide a sufficient difference between opposite and same orientation cells. This circumstance may result in unreliable reading and slow operation. Alternatively, excessive reading current may result in excessive power consumption in the memory device or even generate excessive magnetic fields near the bit lines such that uncontrolled programming occurs. As an addition consideration, the relative timing between the bit line current $I_{BL1}$ and digital sampling of the sensing amplifier 50 output $D_{OUT}$ is critical to achieving reliable, high speed operation. As stated above, achievement of optimal performance over a large number of manufactured memory arrays is difficult due to lot-to-lot or even device-to-device variation in processing parameters.

Several prior art inventions relate to MRAM device architectures and to non-volatile memory configuration. U.S. Pat. No. 6,421,271 to Gogl et al describes a MRAM (magneto-resistive random access memory) architecture in which a single switching transistor is allocated to a plurality of TMR (tunnel magneto-resistive) memory cells. Space requirements for the resulting MRAM array are thereby reduced. U.S. Pat. No. 6,473,335 to Bohm et al is describes a MRAM architecture in which single line driver circuits are assigned via connecting nodes to two memory cell arrays to reduce the space requirements for driver circuits in the overall array.

U.S. Pat. No. 6,487,108 to Pochmuller describes a MRAM architecture in which a plurality of memory cell blocks are supplied with differing operating voltages to optimize use of the available voltage headroom. U.S. Pat. No. 6,577,527 to Freitag et al describes a MRAM device in which compensating currents are provided in the bit lines of unselected cells near a selected cell to counteract stray magnetic field and to thereby prevent undesired programming of the unselected cells. U.S. Pat. No. 6,781,896 to Lammers et al describes a MRAM architecture having redundant cells. Main cells arrays and redundant arrays are provided in a plurality of planes or in other configurations on the same chip.

U.S. Pat. No. 6,791,871 to Freitag et al describes a MRAM array architecture where each unit comprises a selection transistor and a MTJ (magnetic tunnel junction) cell connected in parallel. U.S. Pat. No. 6,462,985 to Hosono et al describes a non-volatile semiconductor memory device with an initial setting function. Initial setting data is held in the non-volatile memory (EEPROM) and is read out during power-up. The initial setting data may include defective array address, control data for programming and erasing, and chip identification codes.

SUMMARY OF THE INVENTION

A principal object of the present invention is to provide an effective and very manufacturable magnetic memory device.

A further object of the present invention is to provide a MRAM device that is electrically configurable.

A yet further object of the present invention is to provide a MRAM device that is electrically re-configurable.

A yet further object of the present invention is to provide a MRAM device with an electrically configurable, redundant address encoding.

A yet further object of the present invention is to provide a MRAM device with electrically configurable, programmable current sources.

A yet further object of the present invention is to provide a MRAM device with electrically configurable, programmable timing delays.

Another further object of the present invention is to provide a method to electrically configure a MRAM device.

In accordance with the objects of this invention, a configurable MRAM device is achieved. The device comprises a memory array of magnetic memory cells. A first part of the array comprises the memory cells that can be accessed for reading and writing during normal operation. A second part of the array comprises the memory cells that can be read only during a power up initialization. The second part of the array is used to store configuration data for altering the physical operation of the memory array.

Also in accordance with the objects of this invention, a configurable MRAM device is achieved. The device comprises a memory array of magnetic memory cells. A first part of the array comprises the memory cells that can be accessed for reading and writing during normal operation. A second part of the array comprises the memory cells that can be read only during a power up initialization. The second part of the array is used to store configuration data for altering the physical operation of the memory array. A programmable current source is included where the performance of the programmable current source is governed by the configuration data.

Also in accordance with the objects of this invention, a method to configure a MRAM device is achieved. The device comprises a memory array of magnetic memory cells. A first part of the array comprises the memory cells that can be accessed for reading and writing during normal operation. A second part of the array comprises the memory cells that can be read only during a power up initialization. The second part of the array is used to store configuration data for altering the physical operation of the memory array. The method comprises storing the configuration data in the second part of the array. A power-up initialization is generated for the device. A fixed number of bytes of the configuration data are read to latch settings for the physical operation of the memory array and to determine the number of variable configuration data rows. All of the variable configuration data rows are read out. The power-up initialization is ended.

BRIEF DESCRIPTION OF THE DRAWINGS

In the accompanying drawings forming a material part of this description, there is shown:

FIG. 13 illustrates a simplified memory map of the configuration data of the present invention.

DESCRIPTION OF THE PREFERRED EMBODIMENTS

The preferred embodiments of the present invention disclose configurable magnetic memory devices, device architectures, and methods to configure magnetic memory devices. It should be clear to those experienced in the art that the present invention can be applied and extended without deviating from the scope of the present invention.

Figure 1:
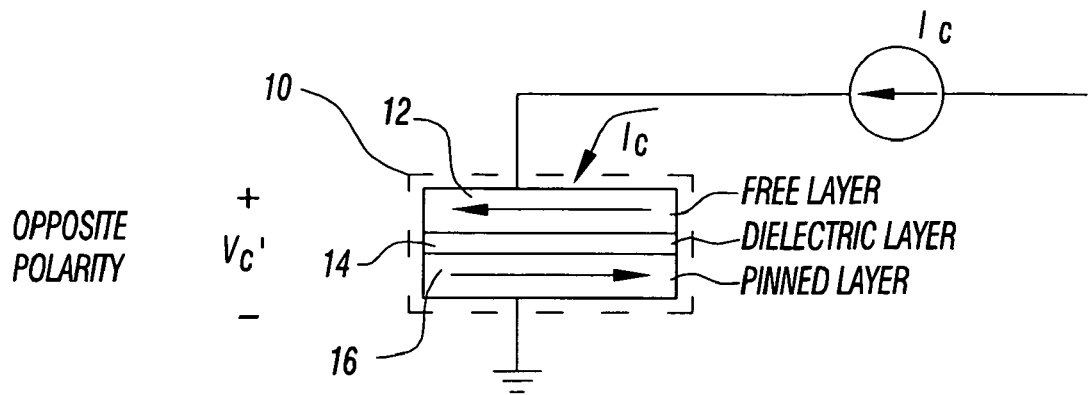
FIG. 1 illustrates an exemplary magnetic memory cell in schematic form showing two polarity cases.
Figure 1:
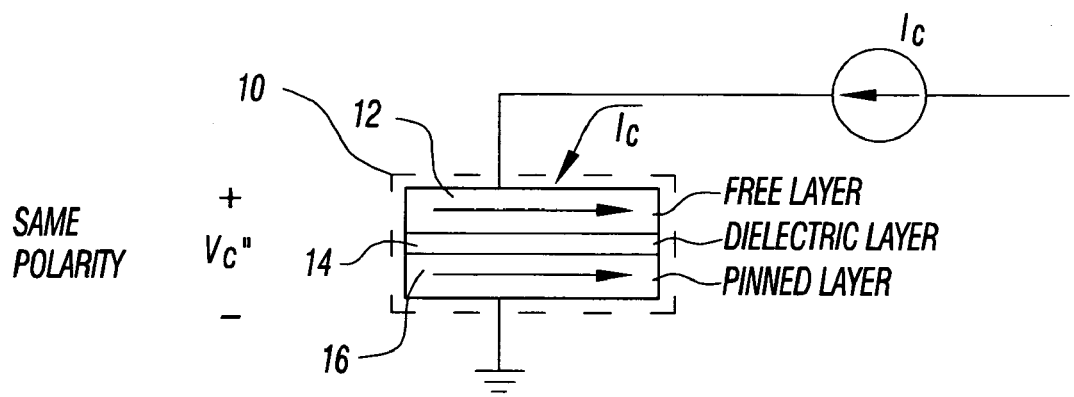
Figure 2:
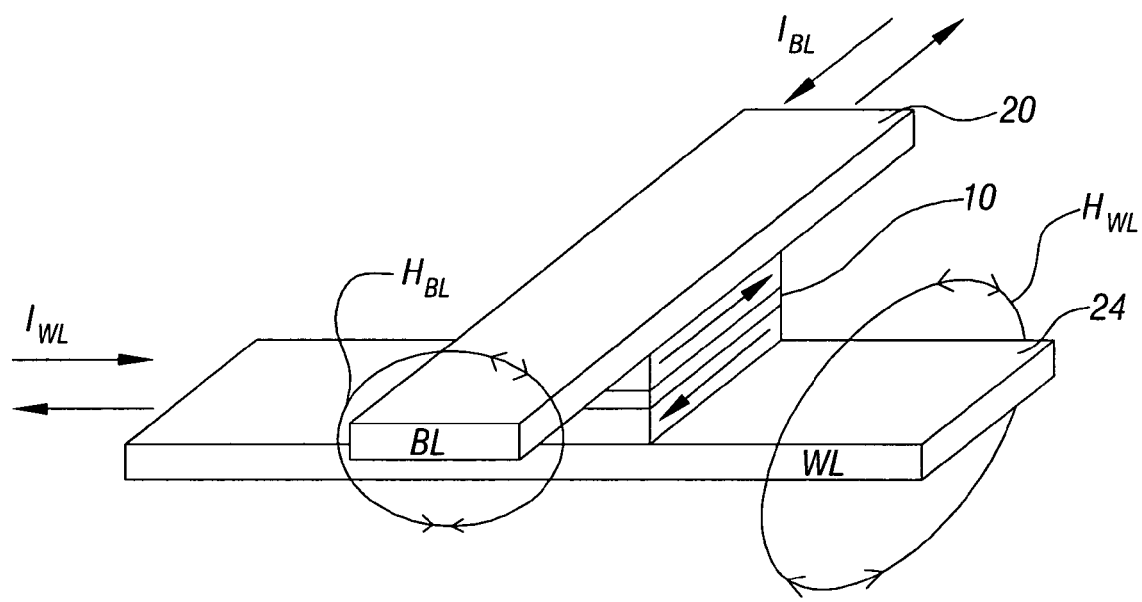
FIG. 2 illustrates an exemplary magnetic memory cell in a simplified isometric illustration.
Figure 3:
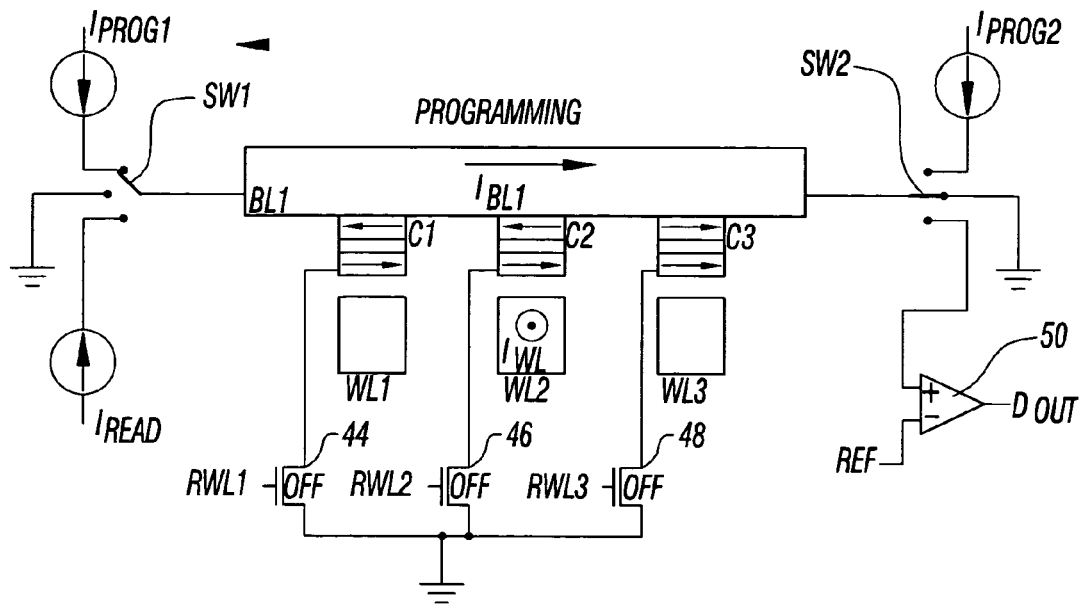
FIG. 3 illustrates an exemplary programming technique used in magnetic memory arrays.
Figure 4:
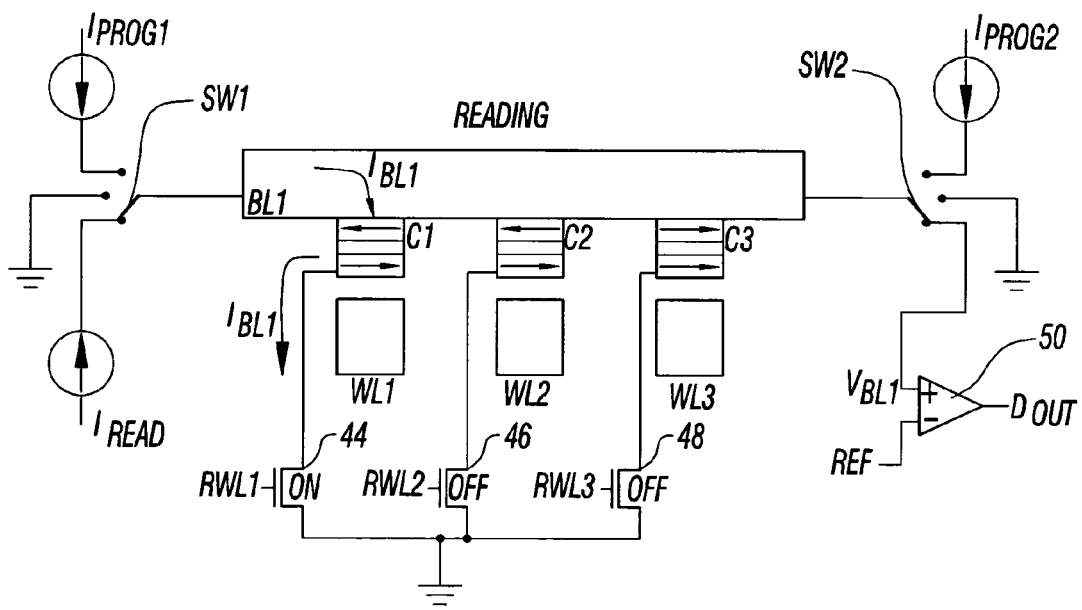
FIG. 4 illustrates an exemplary reading technique used in magnetic memory arrays.
Figure 5:
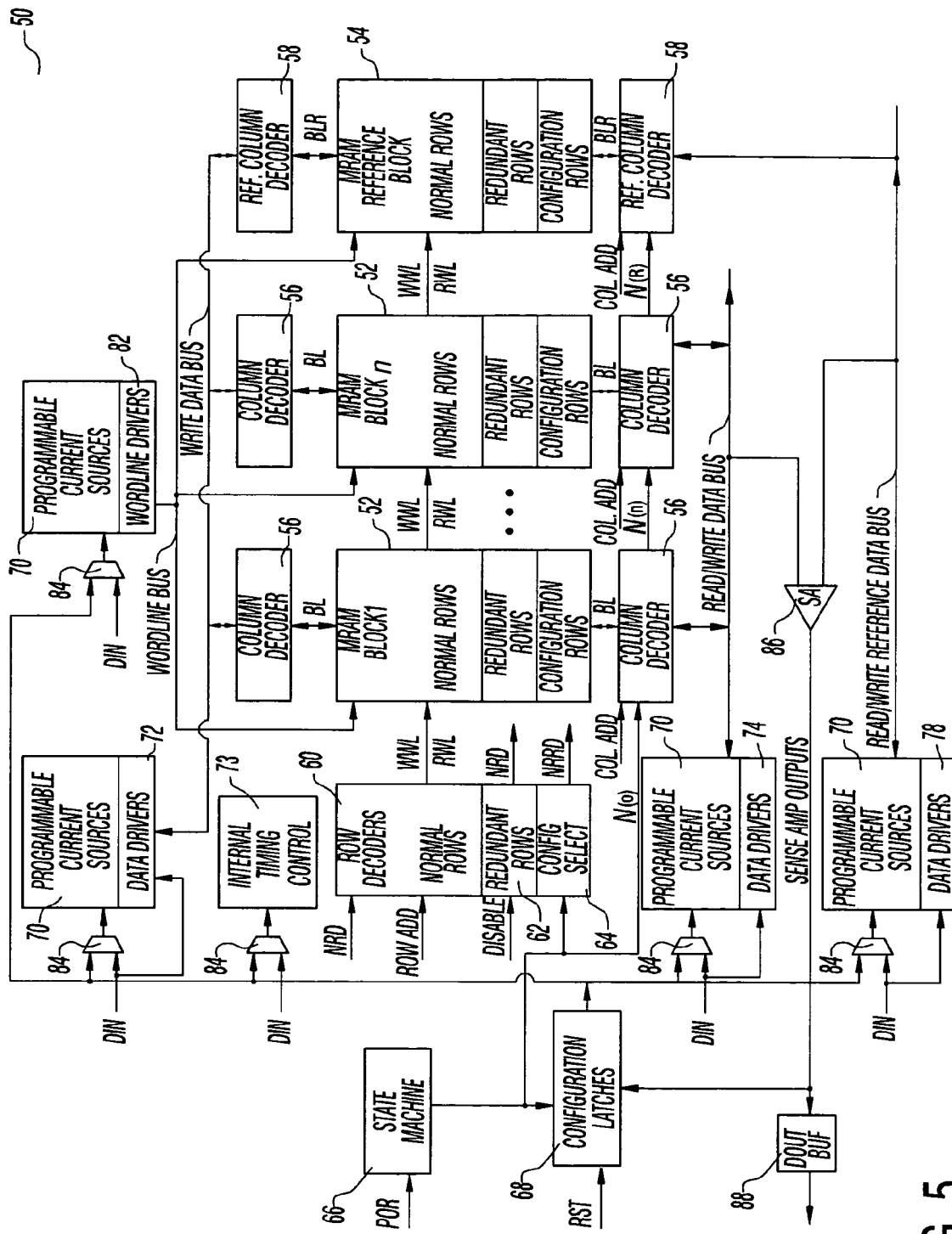
FIG. 5 illustrates a first preferred embodiment of the present invention showing a block diagram of a configurable MRAM.

Referring now to FIG. 5, a first preferred embodiment of the present invention is illustrated. The present invention comprises a configurable magnetic memory array device having several novel architectural and operational features. Particular emphasis will be given to these several novel features in the preferred embodiments described herein. For simplicity of illustration, several independent features of the present invention are shown, together, in common illustrations. However, as is described below, these several individual aspects of the present invention may be implemented independently. That is, various embodiments of the present invention are described wherein a subset of the overall group of novel features is included. For example, in one embodiment, a configurable MRAM device embodiment is described with both programmable current values and redundancy repair information encoded in the configuration block. In another embodiment, only the programmable current values are so encoded. Each embodiment represents a variation intended to fall within the scope of the present invention.

Referring again now to FIG. 5, a preferred embodiment of a schematic of a configurable MRAM device 50 of the present invention is illustrated. In particular, a block level drawing is shown with emphasis on functional blocks, control signals and data flow. The memory array comprises MRAM cell blocks 52 and 54 where magnetic memory cells, like those described in the prior art, are arrayed in blocks accessible by column and row coordinates. In the illustrated embodiment, MRAM BLOCK1 through BLOCKn 52 is configured as storage locations for data writing and reading.

Figure 6:
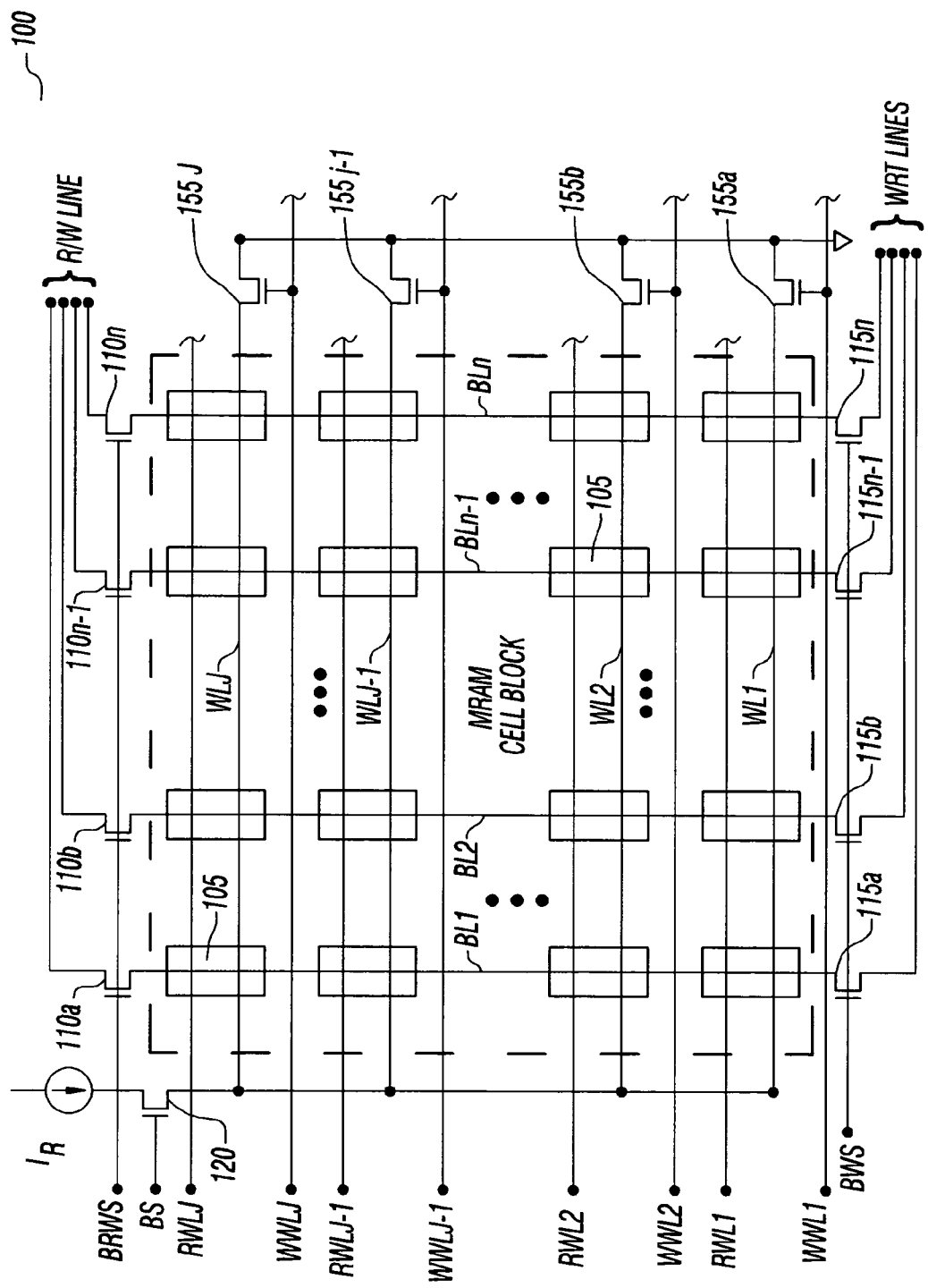
FIG. 6 illustrates a preferred embodiment of a MRAM block shown in schematic form.
Figure 7:
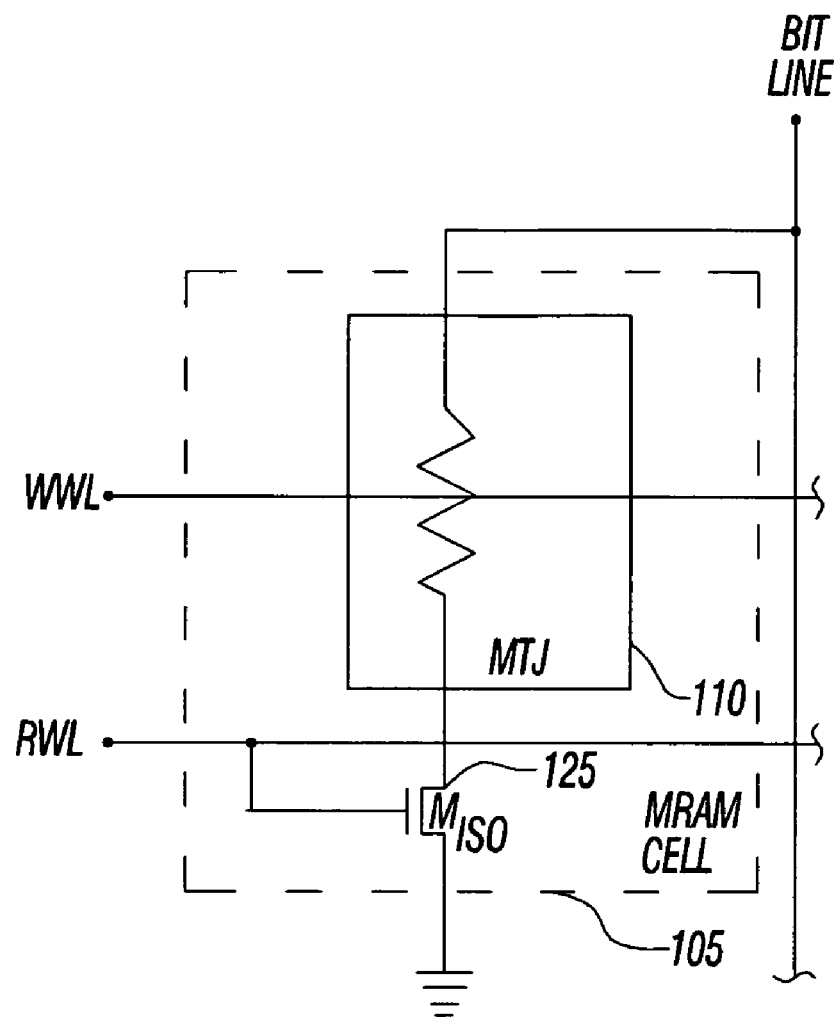
FIG. 7 illustrates a preferred embodiment of a MRAM memory cell in schematic form.

Referring now to FIG. 6, a preferred embodiment of a MRAM block 100 is shown in schematic form. The MRAM cells 105 are organized into rows and columns. Referring now to FIG. 7, an embodiment of a MRAM cell 105 is shown. The memory cell 105 in this embodiment is structured as an MTJ device 110 having a selection/isolation transistor 125 for connecting the cell 105 to ground during a reading operation. Referring again to FIG. 6, each column of the MRAM array has a bit line BL1, BL2, BLn-1, BLn, placed such that the bit line is adjoined to the free magnetic layer of each cell 105 it crosses. Each row of the MRAM array has a write line WL1, WL2, . . . , WLj-1, WLj, placed such that the write line is in close proximity to each cell 105 it crosses. One end of each bit line BL1, BL2, . . . , BLn-1, BLn, is connected to a Read/Write Line (RAN Line) through a Block Read/Write transistor 110a, 110b, . . . , 110n-1, 110n, that is controlled by a Block Read/Write Select (BRWS) signal . At the opposite end, each bit line is connected to a Write Line (WRT Line) through a Block Write Select transistor 115a, 115b, . . . , 115n-1, 115n, controlled by a Block Write Select (BWS) signal. One end of each write line WL1, WL2, . . . , WLj-1, WLj, is connected to ground through a Row Write Select transistor 155a, 155b, . . . , 155j-1, 155j, that is controlled by a Row Select Write Line (WWL1:WWLj). The other end of each write line is connected to the Row Current Source IR through a Block Select transistor 120 that is controlled by the Block Select (BS) signal. Finally, each row of the MRAM cells 105 has a Read Word Line (RWL1:RWLj) that controls each selection/isolation transistor in each cell 105.

In a writing (programming) operation, the Block Select (BS) signal is asserted to turn ON the Block Select transistor 120 and allow the Row Current Source $I_R$ to flow into the array 100. The Row Current Source $I_R$ is then directed to a selected row based on which Row Select Write Line (WWL1:WWLj) is turned ON. A Row Decoder for the MRAM block 100 determines the states of the Block Select (BS) and Row Select Write Line (WWL1:WWLj) signals. Next, the Block Read/Write Select (BRWS) and Block Write Select (BWS) signals are asserted to turn ON the Block Read/Write Select and Block Write Select transistors of the block. All of the Read Word Line (RWL1:RWLj) signals are OFF. Bit line current is then directed through each Read/ Write Line (R/W Line) and Write Line (WRT Line) in either an upward or downward direction depending on the whether a logical "1" or logical "0" is being written. The direction of bit line current is determined by a Data Driver. It can be seen that this particular embodiment provides the ability to program an entire row of cells 105 at one time.

In one exemplary reading operation, the Block Select (BS) signal is turned OFF to shut off programming current $I_R$ in the array. The Block Read Write Select (BRWS) and Block Read Select (BRS) signals are then asserted to turn ON all of the bit lines in the array. Reading current is then conducted through each Write line (WRT Line), through its bit line, and into a Read/Write Line (R/W Line). Next, one of the Read Word Line (RWL1:RWLj) signals is asserted to turn ON the selection/isolation transistors of the cells 105 in that row. The Read Word Line (RWL1:RWLj) signals are controlled by a Row Decoder for the array 100. As a result, the bit line current flowing up through the array will be shunted to ground in the selected row through the selection/ isolation transistors in that row. This bit line current will cross through the MTC cells 105 in that row, however, such that a voltage drop is formed on each Read/Write Line (R/W Line) signals corresponding to the magnetic orientation of the selected MTJ cell 105 for that column and row combination. Many techniques for such reading operations are known in the art.

Several important features for the present invention can be understood based on the exemplary array 100. First, the programming current, $I_R$, is a single value for the entire array. In the preferred embodiment of the present invention, the value of this programming current, $I_R$, is determine by a PROGRAMMABLE CURRENT SOURCE 70 through a WORDLINE DRIVER 82 that drives the WORDLINE BUS as shown in FIG. 5. Second, the programming bit line currents provided to the R/W LINE and WRT LINE buses are have programmable values established by the PROGRAMMABLE CURRENT SOURCES 70 through the WRITE DATA BUS DATA DRIVERS 72 and the READ/ WRITE DATA BUS DATA DRIVERS 74. Third, the reading bit line currents provided to the WRT LINE bus has programmable values established by the PROGRAMMABLE CURRENT SOURCE 70 through the WRITE DATA BUS DATA DRIVERS 72. The preferred embodiment uses configuration data stored in the CONFIGURATON ROWS of any or all of the MRAM Blocks 52 to set the programmable values of these currents during power-up or other initialization event. In addition, the values of these currents may have default values established separately from the configuration data. Fourth, if any cells 105 in any row of the array 100 are found to be defective, then these cells can be easily disabled by disabling the Row Selection signals (RWL, WWL) for the particular row.

Referring again to FIG. 5, in the preferred embodiment, the storage blocks 52 are internally divided into row sections comprising NORMAL ROWS, REDUNDANT ROWS, and CONFIGURATION ROWS. NORMAL ROWS are normally accessible for reading/writing data excepting rows wherein a defective cell has been detected. REDUNDANT ROWS, as the name implies, are not normally accessible for reading/writing data. However, if a defect is detected in a NORMAL ROW location, then a REDUNDANT ROW location is substituted for the NORMAL ROW whenever a read/write is commanded for that location.

In any large memory array, it is common for a small percentage of defective memory cells to be inadvertently formed within the array. If these defective cells can be identified and functionally replaced during operation of the memory device, then the device can still be used rather than being scrapped. In a typical magnetic RAM device, the functional replacement of redundant cells for normal cells is performed by selectively blowing electrical fuses formed in the cell array or in the column or row decoders. These electrical fuses may only be blown one time and may not be returned to their pre-blown states. An important feature of the present invention, as will be described in detail below, is that the re-assignment of address locations from defective NORMAL ROWS to available REDUNDANT ROWS is programmed into the CONFIGURATION ROWS of the memory cell blocks 52.

As described above, a magnetic memory cell is read by comparing the voltage drop generated by a current traversing the cell with a voltage reference. In the preferred embodiment, the voltage reference value is generated by conducting a current through a reference cell or a set of reference cells in a MRAM REFERENCE BLOCK 54. Variations in cell performance due to manufacturing, cell placement or orientation, environmental factors, and the like, will similarly scale between the selected cells in the MRAM BLOCK1-$n$ 52 and the reference cells in the MRAM REFERENCE BLOCK 54 such that scaleable reading reference voltages are generated. The reference cell voltages from the MRAM REFERENCE BLOCK 54 are presented as reference bit lines BLR on the READ/WRITE REFERENCE DATA BUS for comparison with the bit line BL for the selected cells in the MRAM BLOCKS1-$n$ 52. Sense amplifiers SA 86 thereby compare the selected read cells from the MRAM BLOCKS1-$n$ 52 with the reference cells in the MRAM REFERENCE BLOCK 54 to generate SENSE AMP OUTPUTS that are then latched may be latched in the data output buffer (DOUT BUF) 88, the CONFIGURATION LATCHES 68, and the like.

In the preferred embodiment, the MRAM BLOCK1-$n$ 52 and MRAM REFERENCE BLOCK 54 are defined by the local word line length in a segmented word line approach. Each cell block 52 and 54 comprises normal MRAM cells, redundant cells for replacing defective normal cells, and configuration cells. Bit lines BL for the MRAM BLOCK1-$n$ 52 are connected to the WRITE DATA BUS through COLUMN DECODERS 56 and are connected to the READ/ WRITE DATA BUS through COLUMN DECODERS 56. The WRITE DATA BUS is driven by DATA DRIVERS 72. The READ/WRITE DATA BUS is driven by DATA DRIVERS 74. Similarly, the bit lines BLR for the MRAM REFERENCE BLOCK 54 are connected to the WRITE DATA BUS through COLUMN DECODER 58 and are connected to the READ/WRITE DATA BUS through COLUMN DECODER 58. The REFERENCE READ/WRITE DATA BUS is driven by DATA DRIVERS 78. Bi-directional currents are provided by the DATA DRIVERS 72 and 74 for the bit lines BL for programming the MRAM cells. Word line programming current is generated by the WORDLINE DRIVERS 82.

As an important feature of the preferred embodiment, PROGRAMMABLE CURRENT SOURCES 70 provide the current levels for the DATA DRIVERS 72, 74, 78 and WORDLINE DRIVERS 82. The PROGRAMMABLE CURRENT SOURCES 70 are programmed based on the information stored in the CONFIGURATION ROWS of the MRAM BLOCKS1-N 52 as further described below. In the most preferred embodiment, each PROGRAMMABLE CURRENT SOURCE 70 is individually programmed based on an individual configuration field, or value, read during power up or other initialization. In a different embodiment, all of the PROGRAMMABLE CURRENT SOURCES 70 are programmed using the same configuration field or value. In yet another embodiment, only some of the PROGRAMMABLE CURRENT SOURCES 70 are controlled by a configuration field, or value, while other PROGRAMMABLE CURRENT SOURCES 70 are not. It should be noted that the current value of each PROGRAMMABLE CURRENT SOURCE 70 can be selected externally, independent of the configuration data, by setting the device into a test mode and by forcing DIN to the desired state. In this way, current values for operation of the MRAM device 50 can be evaluated and optimized during device testing. The optimal current values may then be written into the CONFIGURATION ROWS for future use.

Figure 8:
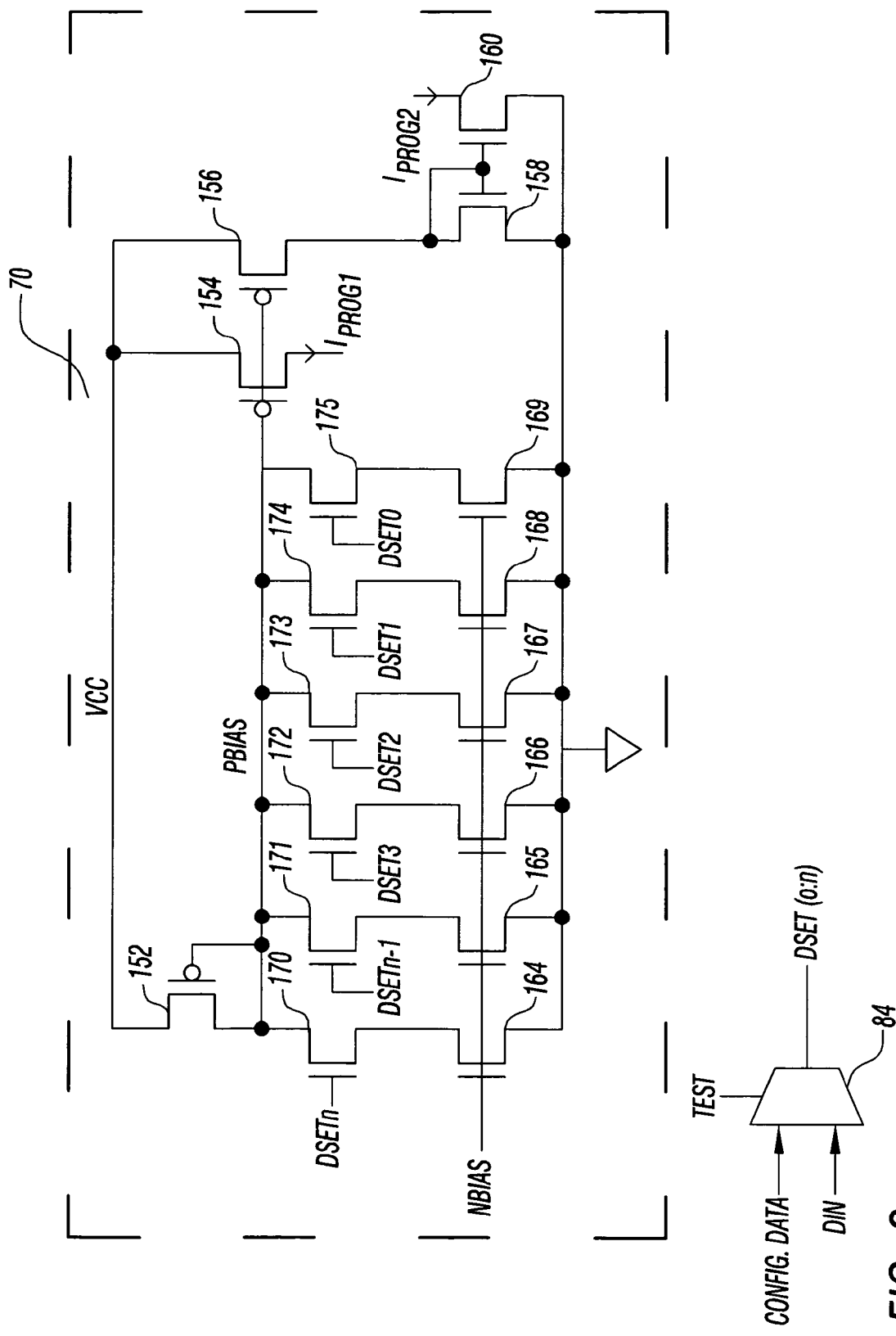
FIG. 8 illustrates a preferred embodiment of a programmable current source circuit shown in schematic form.

Referring now to FIG. 8, one preferred embodiment of a programmable current source circuit 70 is illustrated in schematic form. The programmable current source circuit 70 comprises a series of NMOS switches 170-175 that are controlled by the state of the output (DSET(0:n)) of the multiplexer 84. When TEST is asserted during test mode, DSET(0:n) corresponds to the external Data Input Bus (DIN). When TEST is not asserted (non-test mode), DSET(0:n) corresponds to the values latched on the CONFIGURATION LATCHES 68 shown in FIG. 5. Referring again to FIG. 7, another series of NMOS devices 164-169 are biased to a reference voltage (NBIAS). A diode-connected PMOS device 152 provides a current path from the VCC supply to the NMOS devices 164-169. The NMOS devices 164-169 may be similarly sized or may be sized in binary relative increments. As can be seen, the number and selection of DSET(0:n) signals will determine the current value flowing through the combined NMOS network and PMOS diode. This current value will set the PBIAS value that is then used to drive turn-around PMOS devices 154 and 156. A first current tap, $I_{PROG1}$, demonstrates a current source while a second current tap, $I_{PROG2}$, demonstrates a current sink from same circuit.

Referring again to FIG. 5, in another important feature of the preferred embodiment, defective cell (or row) information is stored in the CONFIGURATION ROWS of the MRAM 52. During a power up, or other initialization scheme, this information in the CONFIGURATION ROWS is read and then latched to program the REDUNDANT ROW DECODER 62 to thereby replace defective row locations in the NORMAL ROWS with REDUNDANT ROWS. When any of the defective row locations is later selected for reading or writing, then the Normal Row Disable (NRD) signal is asserted by the REDUNDANT ROW DECODER 62 to de-select the normal (defective) row that would otherwise have been selected by the address combination. In addition, in the preferred embodiment, the REDUNDANT ROW DECODER 62 is designed such that when it is not programmed, or when no redundant configuration latches are set, then none of the redundant rows is selected by any address combination. Further, if any of the REDUNDANT ROW DECODERS is selected, then a Normal Row Disable (NRD) signal is asserted to thereby disable all of the NORMAL ROW DECODERS. The number of rows implemented in the REDUNDANT ROWS section of the MRAM BLOCKS1-$n$ 52 depends upon the defect density of the technology. A higher defect density technology requires a larger number of redundant rows than a lower defect density technology. A redundant row repair scheme is illustrated in the preferred embodiment of FIG. 5. However, it would be apparent to one skilled in the art that a column repair scheme may be similarly implemented using the configuration methodology of the present invention.

Figure 11:
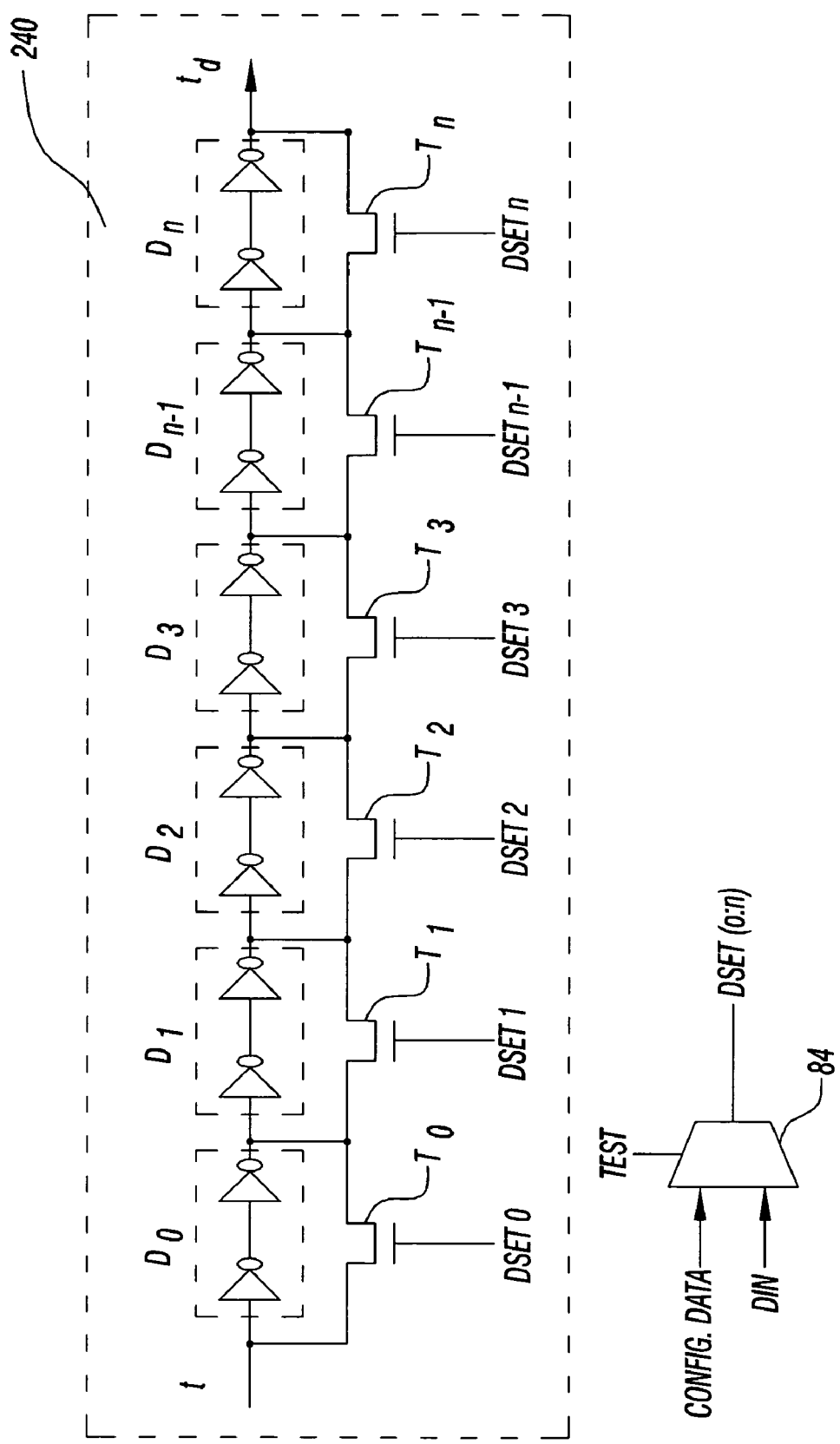
FIG. 11 illustrates a preferred embodiment of a programmable delay circuit shown in schematic form.

In yet another important feature of the preferred embodiment, internal clock timings and/or clock delays may be programmed using configuration information stored in the CONFIGURATION ROWS of the MRAM BLOCKS1-$n$ 52. During power up or other initialization, configuration information is read from the CONFIGURATION ROWS of the MRAM BLOCKS1-$n$ 52 and latched into the INTERNAL TIMING CONTROL block 73. Referring now to FIG. 11, one embodiment of a programmable timing delay block 240 of the present invention is illustrated in schematic form. The programmable delay block 240 uses the configuration data to program a delay time between an input signal t and an output signal $t_d$. The delay created by a series of delay buffers D0:Dn. Each delay buffer comprises a pair of invertors such that the input signal at t is effectively not inverted at $t_d$. Each delay buffer is further associated with a selection transistor $T_0:T_n$. When a selection transistor is turned ON, then the input signal is shorted across the buffer such that no delay is induced by that buffer. When a selection transistor is turned OFF, then the signal is delayed by the effect of the buffer. Each selection transistor $T_0:T_n$ is controlled by a bit of the configuration data byte DSET(0:n) such that a delay is programmed based on the configuration value. Processing variations can create variation in performance of the memory cells between different die on the same wafer, between wafers, or between lots. Significant variation can create situations wherein a single internal timing delay arrangement will not work over the range of variation. Therefore, it is particularly useful to be able to program specific timing delay values based on testing data from the memory device as a means of optimizing circuit performance and/or improving device yield. As in the case of programmable current sources, the INTERNAL TIMING CONTROL circuit can also be programmed via the external DIN signal during test mode using the multiplexer 84. This feature allows various timing values to be tested and optimized prior to committing to a configuration value. The INTERNAL TIMING CONTROL may also have default values separate from the Configuration Value.

Figure 9:
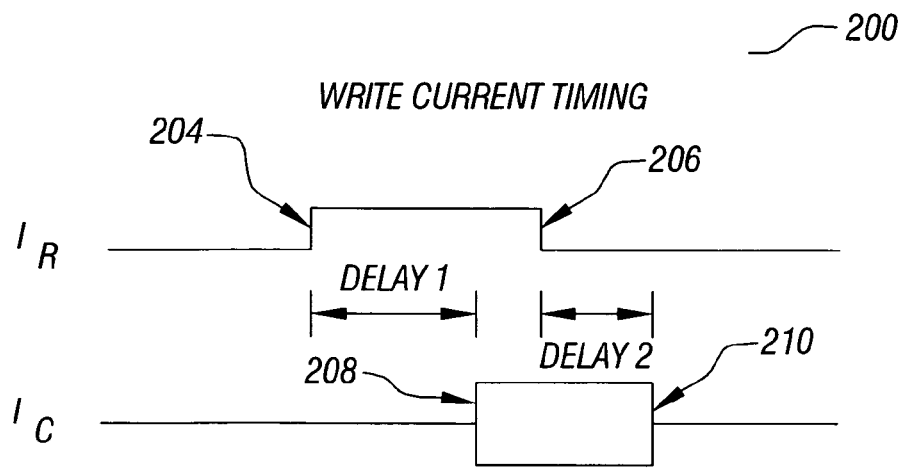
FIG. 9 illustrates a preferred embodiment of the present invention showing timing relationships between writing currents in the magnetic array.

Referring now to FIG. 9, a preferred embodiment of the present invention is illustrated wherein a timing relationship 200 between writing currents ($I_R$ and $I_C$) provided to the memory array during a programming event are shown in a timing diagram format. As described above, a combination of word line current and bit line current is used to generate magnetic fields to program the memory cells. The word line, or row, current $I_R$ and the bit line, or column, current $I_C$ flow concurrently to generate the programming magnetic fields. To insure reliable programming while minimizing programming time, it is found that the row current $I_R$ should turn ON 204 prior to the turn ON 208 of the column current $I_C$ by a setup time DELAY1. Further, the column current $I_C$ should not turn OFF 210 until a hold time DELAY2 after the row current $I_R$ is turned OFF 206. The optimal setup time DELAY1 and hold time DELAY2 depend, in part, on the processing parameters for the circuit. To optimize writing performance it is useful to adjust setup time DELAY1 and hold time DELAY2 based on testing of the manufactured device. The programmable timing circuit of FIG. 8 is used to adjust the setup time DELAY1 and hold time DELAY2 using configuration values that are altered during testing and then stored into the configuration area of the array for subsequent use during power-up.

Figure 10:
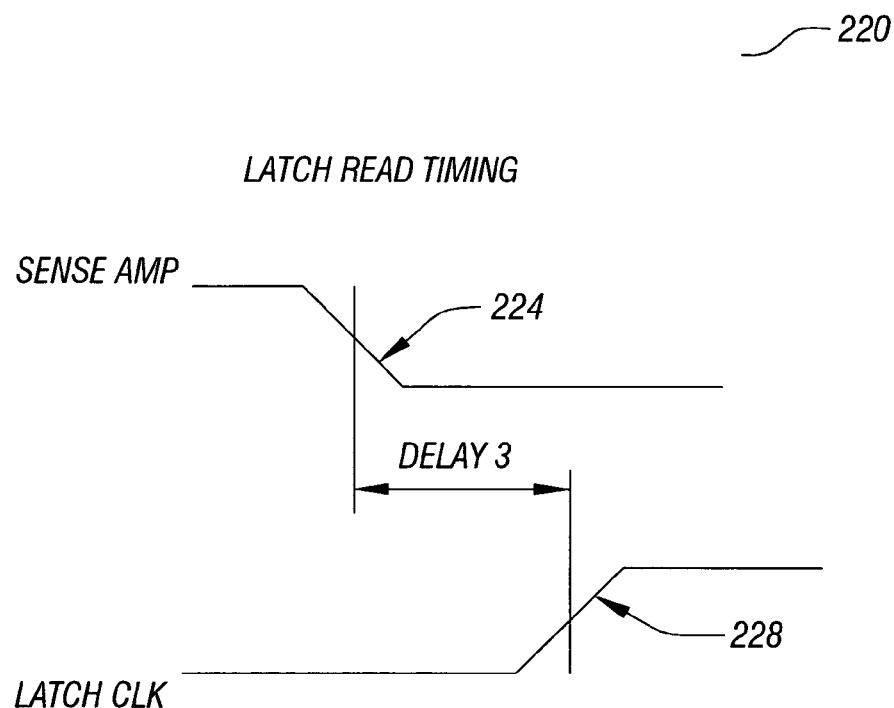
FIG. 10 illustrates a preferred embodiment of the present invention showing timing relationships for sensing and latching read data from the magnetic array.

Referring now to FIG. 10, a preferred embodiment of the present invention is illustrated wherein a timing relationship 220 between sense amplifier outputs and clock cycle, or clock delay, signals for latching these sense amplifier outputs is shown in a timing diagram format. As described above, a memory cell in the array is read by measuring the voltage drop induced across the cell in response to the conduction of a known current. Typically a plurality of cells is read concurrently in the form of a byte or a word. In one embodiment, the voltage drops for each cell are propagated onto individual bit lines and routed to sense amplifiers. At the sense amplifiers, the voltage on each bit line is compared to a reference voltage to determine the programming state of the memory cell associated with each bit line. To insure reliable reading while minimizing reading time, it is found that setup time DELAY3 should be maintained between the state transition 224 of the sense amplifier output and the clock edge 228 for latching the output data value. The optimal setup time DELAY3 depends, in part, on the processing parameters for the circuit. To optimize reading performance it is useful to adjust the setup time DELAY3 based on testing of the manufactured device. The programmable timing circuit of FIG. 8 is used to adjust the setup time DELAY3 using configuration values that are altered during testing and then stored into the configuration area of the array for subsequent use during power-up.

As yet another important feature of the preferred embodiment, a STATE MACHINE block 66 is included in the memory architecture. During a power-on reset (POR), or other initiation signal, the STATE MACHINE 66 will activate the CONFIGURATION SELECT block 64 of the ROW DECODER 60. The CONFIGURATION SELECT block 64 performs as a row decoder for the CONFIGURATION ROWS by providing word line selection for the cells on this row. When the CONFIGURATION SELECT block 64 is activated, the block 64 asserts the Normal and Redundant Row Disable (NRRD) to disable all of the normal and redundant rows such that only the CONFIGURATION ROWS can be selected. The STATE MACHINE block 66 also generates selection signals N(0)-N(n) and N(R) and appropriate column addresses to provide column selection for reading the CONFIGURATION ROWS. The CONFIGURATION ROWS are read using the same Sense Amplifiers (SA) 86 as are used for reading NORMAL ROWS. The STATE MACHINE 66 generates a signal to latch the SENSE AMP OUTPUTS into the CONFIGURATION LATCHES 68. All or part of the bits of the selected row of the CONFIGURATION ROWS may be latched on each reading cycle or on a number of reading cycles. Successive rows of the CONFIGURATION ROWS are read in this way and latched into the CONFIGURATION LATCHES 68 as needed until all of the necessary configuration data are read and latched. In one embodiment, the CONFIGURATION ROWS are formed as a single row of cells. In the preferred embodiment, several rows are used.

Figure 12:
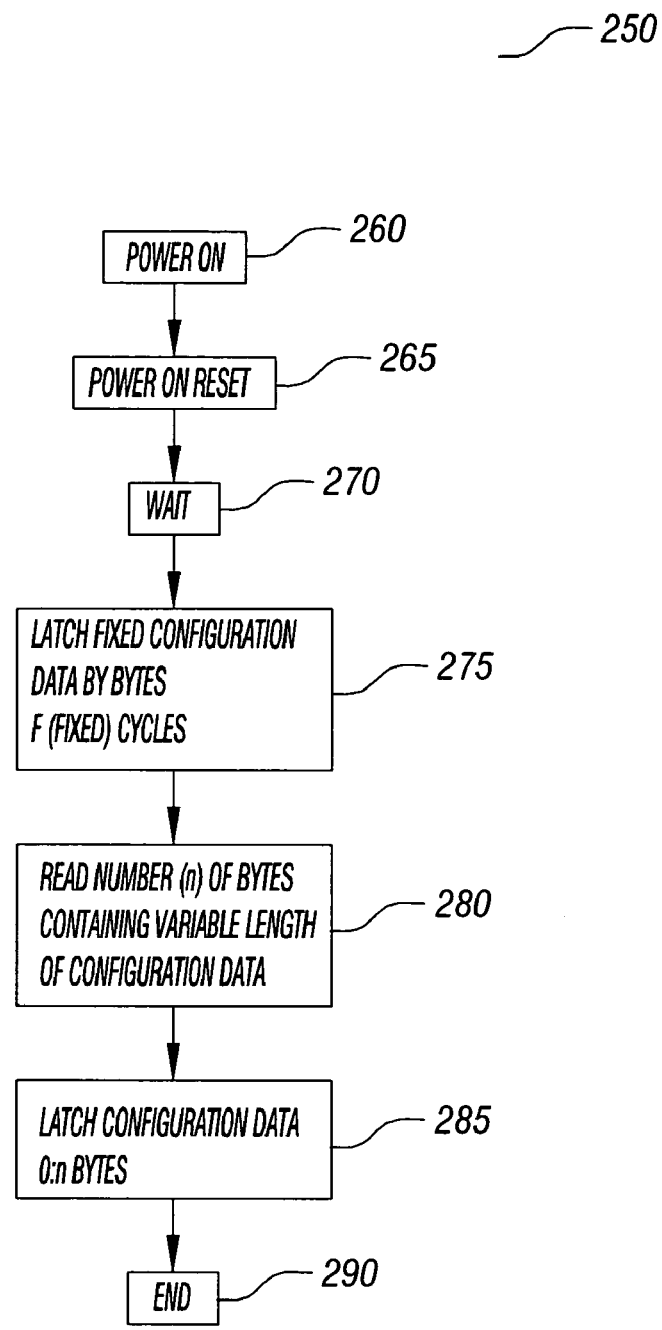
FIG. 12 illustrates a preferred embodiment of a method of configuring a MRAM device of the present invention is shown in flow chart form.

Referring now to FIG. 12, another preferred embodiment of the present invention is illustrated. A flow chart 250 is shown illustrating a preferred configuration method for the configurable MRAM device of the present invention. Upon a power up of the MRAM device in step 260, a power on reset (POR) signal is generated by a circuit that detects the power supply transition on the device in step 265. Alternatively, a reset signal may be used to simulate a power on reset of the device. After the power on reset initiates, a short wait period, typical of a power up reset, begins in step 270. In the preferred embodiment, the remaining steps 275-290 will be completed during the typical power up sequence while POR is enabled without the need for an internal or external Ready/Busy signal. The CONFIGURATION DATA in the MRAM array is then read in steps 275-285.

Referring now to FIG. 13, a simplified memory map 300 of the CONFIGURATION DATA is shown. The CONFIGURATION DATA is divided into two sections: FIXED and VARIABLE. The FIXED data comprises configuration bytes or words to set the programmable current source values and to set the programmable timing delays. In the map 300, six programmable current rows and four programmable timing rows are shown as an example. The number of rows in this section is fixed by the design of the MRAM device at $_{10}$ rows (ROW0-ROW9) in this embodiment. The VARIABLE data comprises a header byte, or bytes, that provides the number (n) of rows, or bytes, of defective addresses that are written into the CONFIGURATION DATA for replacement with redundant rows. In the map shown, a single REDUNDANT BLOCK SIZE is shown as ROW10. Alternatively, two or more rows may be used to hold the block size information as long as the number of rows for the REDUNDANT BLOCK SIZE information is fixed. In this case, the REDUNDANT BLOCK SIZE row yields a remaining row count of n. Therefore, rows ROW11 through ROW10+n contain information on addresses replaced by redundant rows.

Referring again to FIG. 12, the above-described FIXED rows of the CONFIGURATION DATA are latched in step 275. The number (n) of bytes remaining in the VARIABLE CONFIGURATION DATA is then read in step 280. Finally, the VARIABLE CONFIGURATION DATA containing redundant address values is latched in step 285 before the sequence ends in step 290. The method described allows the STATE MACHINE 66 to read out and latch the contents of the CONFIGURATION DATA block in a short time period after POR using the same reading mechanism as used in normal mode and with an ending point defined in the CONFIGURATION DATA.

Programming of the CONFIGURATION DATA is achieved in the preferred embodiment by essentially the normal writing architecture and operations with the exception of the Configuration Select signal substituted for the word line select. As described above, the PROGRAMMABLE CURRENT SOURCES 70 and INTERNAL TIMING CONTROL 73 may additionally be programmed by external inputs during the initial testing to determine their optimal values. An external input path is the DATA IN (DIN) bus selected by the multiplexers 84 during a test mode. In addition, the PROGRAMMABLE CURRENT SOURCES 70 and INTERNAL TIMING CONTROL 73 have internal default values in one embodiment.

The advantages of the present invention may now be summarized. A very manufacturable magnetic memory device is achieved. A MRAM device that is electrically configurable and re-configurable is achieved. A MRAM device having an electrically configurable, redundant address encoding is achieved. A MRAM device with electrically configurable, programmable current sources is achieved. A MRAM device with electrically configurable, programmable timing delays is achieved. A method to electrically configure a MRAM device is achieved.

As shown in the preferred embodiments, the novel device and method of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A configurable MRAM device comprising an array of magnetic memory cells wherein a first part of said array comprises said memory cells that can be accessed for reading and writing during normal operation, wherein a second part of said array comprises said memory cells that can be read only during a power up initialization, and wherein said second part of said array is used to store configuration data for altering the physical operation of said array.

2. The device according to claim 1 further comprising a programmable current source wherein the performance of said programmable current source is governed by said configuration data.

3. The device according to claim 2 wherein said programmable current source provides bit line current for reading a magnetic memory cell.

4. The device according to claim 2 wherein said programmable current source provides bit line current for writing a magnetic memory cell.

5. The device according to claim 2 wherein said programmable current source provides word line current for writing a magnetic memory cell.

6. The device according to claim 2 wherein performance of said programmable current source is governed by an external input to said device when said device is in test mode.

7. The device according to claim 1 further comprising a programmable timing controller wherein the performance of said programmable timing controller is governed by said configuration data.

8. The device according to claim 7 wherein said programmable timing controller provides a delay time between delivering word line current and delivering bit line current to said magnetic memory cells during a writing operation.

9. The device according to claim 7 wherein said programmable timing controller controls the timing of latching data sensed from said array during a reading operation.

10. The device according to claim 7 wherein performance of said programmable timing controller is governed by an external input to said device when said device is in test mode.

11. The device according to claim 1 further comprising a third part of said array comprising said memory cells that can be accessed for reading and writing in normal operation only as redundant cells that are activated when said memory cells of said first part of array are identified as defective by said configuration data.

12. The device according to claim 11 wherein said configuration data is read during power up initialization by a method comprising:
reading a fixed number of bytes to determine how many defective cell addresses have been replaced by redundant cell addresses; and
reading out all of said defective cell addresses.

13. The device according to claim 11 wherein a normal row in said first part of said array is disabled when a redundant row in said third part of said array is enabled.

14. The device according to claim 1 wherein a second array of said magnetic memory cells provides bit line reference values for reading operations.

15. A configurable MRAM device comprising:
an array of magnetic memory cells wherein a first part of said array comprises said memory cells that can be accessed for reading and writing during normal operation, wherein a second part of said array comprises said memory cells that can be read only during a power up initialization, wherein said second part of said array is used to store configuration data for altering the physical operation of said array; and
a programmable current source wherein the performance of said programmable current source is governed by said configuration data.

16. The device according to claim 15 wherein said programmable current source provides bit line current for reading a magnetic memory cell.

17. The device according to claim 15 wherein said programmable current source provides bit line current for writing a magnetic memory cell.

18. The device according to claim 15 wherein said programmable current source provides word line current for writing a magnetic memory cell.

19. The device according to claim 15 wherein performance of said programmable current source is governed by an external input to said device when said device is in test mode.

20. The device according to claim 15 further comprising a programmable timing controller wherein the performance of said programmable timing controller is governed by said configuration data.

21. The device according to claim 20 wherein said programmable timing controller provides a delay time between delivering word line current and delivering bit line current to said magnetic memory cells during a writing operation.

22. The device according to claim 21 wherein said programmable timing controller controls the timing of latching data sensed from said array during a reading operation.

23. The device according to claim 21 wherein performance of said programmable timing controller is governed by an external input to said device when said device is in test mode.

24. The device according to claim 15 further comprising a third part of said array comprising said memory cells that can be accessed for reading and writing in normal operation only as redundant cells that are activated when said memory cells of said first part of array are identified as defective by said configuration data.

25. The device according to claim 24 wherein said configuration data is read during power up initialization by a method comprising:
reading a fixed number of bytes of said configuration data to determine the number of cell addresses that have been replaced by redundant cell addresses; and
thereafter reading out all of said defective cell addresses of said configuration data.

26. The device according to claim 24 wherein a normal row in said first part of memory array is disabled when a redundant row in said third part of memory array is enabled.

27. The device according to claim 15 wherein a second array of said magnetic memory cells provides bit line reference values for reading operations.

28. A method to configure a MRAM device, said device comprising an array of magnetic memory cells wherein a first part of said array comprises said memory cells that can be accessed for reading and writing during normal operation, wherein a second part of said array comprises said memory cells that can be read only during a power up initialization, and wherein said second part of said array is used to store configuration data for altering the physical operation of said array, and said method comprising:
storing said configuration data in said second part of array;

thereafter generating a power-up initialization for said device;

thereafter reading a fixed number of bytes to latch settings for said physical operation of said array and to determine the number of variable configuration data rows;

thereafter reading out all of said variable configuration data rows; and thereafter ending said power-up initialization.

29. The method according to claim 28 wherein said device further comprises a programmable current source wherein the performance of said programmable current source is governed by said configuration data.

30. The method according to claim 29 further comprising testing the performance of said programmable current source by controlling said programmable current source via an external input to said device in test mode prior to said step of storing said configuration data in said second part of array.

31. The method according to claim 29 wherein said device further comprises a programmable timing controller wherein the performance of said programmable timing controller is governed by said configuration data.

32. The method according to claim 31 further comprising testing the performance of said programmable timing controller by controlling said programmable timing controller via an external input to said device in test mode prior to said step of storing said configuration data in said second part of array.

33. The method according to claim 28 wherein said device further comprises a third part of said array comprising said memory cells that can be accessed for reading and writing in normal operation only as redundant cells that are activated when said memory cells of said first part of array are identified as defective by said configuration data.

* * * * *